US012800674B2

(12) United States Patent
Cantrell et al.

(10) Patent No.: US 12,800,674 B2
(45) Date of Patent: Nov. 17, 2026

(54) ELECTRICAL OUTLET FAULT DETECTION

(71) Applicant: Dwellwell Analytics, Inc., Bethesda, MD (US)

(72) Inventors: Cynthia E. Cantrell, Hagerstown, MD (US); Joseph E. Anstett, III, Raleigh, NC (US)

(73) Assignee: Dwellwell Analytics, Inc., Bethesda, MD (US)

( * ) Notice: Subject to any disclaimer, the term of this patent is extended or adjusted under 35 U.S.C. 154(b) by 178 days.

(21) Appl. No.: 18/834,199

(22) PCT Filed: Jan. 30, 2023

(86) PCT No.: PCT/US2023/011856
§ 371 (c)(1),
(2) Date: Jul. 29, 2024

(87) PCT Pub. No.: WO2023/147121
PCT Pub. Date: Aug. 3, 2023

(65) Prior Publication Data

US 2025/0110189 A1 Apr. 3, 2025

Related U.S. Application Data

(60) Provisional application No. 63/305,114, filed on Jan. 31, 2022.

(51) Int. Cl.
*G01R 31/52* (2020.01)
*G01R 19/165* (2006.01)
(Continued)

(52) U.S. Cl.
CPC ....... *G01R 31/52* (2020.01); *G01R 19/16547* (2013.01); *G01R 19/2513* (2013.01); *G01R 31/67* (2020.01)

(58) Field of Classification Search
None
See application file for complete search history.

(56) References Cited

U.S. PATENT DOCUMENTS 5,229,651 A 7/1993 Baxter, Jr.
7,558,033 B2 7/2009 Zhou
(Continued)

OTHER PUBLICATIONS

International Search Report and Written Opinion for PCT/US2023/011856 mailed Jun. 7, 2023 (11 pages) .
(Continued)

*Primary Examiner* — Jas A Sanghera
(74) *Attorney, Agent, or Firm* — Klintworth & Rozenblat LLP

(57) ABSTRACT

Example embodiments include an apparatus and a method for electrical outlet fault detection. In an example method, a sensor device conducts measurements of: a line-ground voltage at an AC power outlet, a neutral-ground voltage at the AC power outlet, and a line-neutral voltage at the AC power outlet. A line/neutral ratio is determined between the line-ground voltage and the neutral-ground voltage. An outlet fault type is determined based at least in part on the line/neutral ratio and the line-neutral voltage. The voltages may be determined on a continual basis, reports of an identified outlet fault type may be provided visually, audibly, or wirelessly.

19 Claims, 12 Drawing Sheets

(51) Int. Cl.
*G01R 19/25* (2006.01)
*G01R 31/67* (2020.01)

(56) References Cited

U.S. PATENT DOCUMENTS

| | | | | |
|---|---|---|---|---|
| 9,702,959 | B2 | 7/2017 | Marshall | |
| 10,018,701 | B2 | 7/2018 | Marshall | |
| 10,641,806 | B2 | 5/2020 | Marshall | |
| 11,249,125 | B2 | 2/2022 | Marshall | |
| 11,552,501 | B2 | 1/2023 | Sloop | |
| 11,754,607 | B2 | 9/2023 | Marshall | |
| 2005/0105230 | A1* | 5/2005 | Bailey | G01R 19/2513 361/90 |
| 2007/0210808 | A1* | 9/2007 | Yang | G01R 27/205 324/691 |
| 2007/0258175 | A1 | 11/2007 | Montgomery | |
| 2008/0036466 | A1 | 2/2008 | Raber | |
| 2018/0321350 | A1 | 11/2018 | Marshall | |
| 2019/0372340 | A1* | 12/2019 | Lee | H02H 9/041 |
| 2023/0160941 | A1 | 5/2023 | Sloop | |

OTHER PUBLICATIONS

International Preliminary Report on Patentability for PCT/US2023/011856 mailed Aug. 6, 2024 (7 pages).

* cited by examiner

ELECTRICAL OUTLET FAULT DETECTION

CROSS-REFERENCE TO RELATED APPLICATIONS

The present application is a national stage application under 35 U.S.C. § 371 of International Application No. PCT/US2023/011856, entitled "ELECTRICAL OUTLET FAULT DETECTION," filed Jan. 30, 2023, which claims benefit under 35 U.S.C. § 119 (e) from, U.S. Provisional Patent Application Ser. No. 63/305,114, entitled "Electrical Outlet Fault Detection," filed Jan. 31, 2022, which are hereby incorporated by reference in their entirety.

BACKGROUND

The present disclosure relates to the detection and identification of potential faults at an alternating current (AC) power outlet.

Electrical circuits are a critical feature of a home. If they are wired improperly, they can damage other equipment in the home and can even result in fire of the whole structure. Electricity flowing through the outlets can vary in quality as well and should be monitored so that stress to appliances and wiring can be minimized.

Today the homeowner has little visibility into the operation of the electrical performance of their home. Homeowner monitoring is typically limited to noticing that a circuit breaker tripped and needs to be reset or noticing that the whole home lost power in a blackout. Some percentage of homeowners will buy and use a testing device, such as that illustrated in FIG. 11. However, such devices are not often in use until a hazardous condition has already started to cause noticeable problems.

SUMMARY

Example embodiments include an apparatus and a method for electrical fault detection. In an example method, a sensor device conducts measurements of: a line-ground voltage at an AC power outlet, a neutral-ground voltage at the AC power outlet, and a line-neutral voltage at the AC power outlet. A line/neutral ratio is determined between the line-ground voltage and the neutral-ground voltage. An electrical fault type is determined based at least in part on the line/neutral ratio and the line-neutral voltage. The voltages may be determined on a continual basis. Reports of an identified outlet fault type may be provided visibly, audibly, or wirelessly.

BRIEF DESCRIPTION OF THE DRAWINGS

FIG. 1A is a top view. FIG. 1B is a front view. FIG. 1C is a bottom view. FIG. 1D is a right side view. FIGS. 1E and 1F are front perspective views.

DETAILED DESCRIPTION

As illustrated in FIGS. 1A-1F, a device 100 includes a housing 108 having a rear surface 104. A set of power plug prongs 106 including a line prong, a neutral prong and a ground prong extends from the rear surface of the housing. Although the illustrated prongs are those compatible with standard North American outlets, other configurations may alternatively be used.

The present disclosure relates to circuit design and associated processing to measure electrical attributes and detect electrical fault conditions such as wiring and/or outlet fault conditions.

Example embodiments allow for continual monitoring of electrical circuit performance and detection of issues with electrical outlet wiring and with electrical health overall. Since the quality of electricity supplied by the power company and affected by the loads within the house varies over time and since things like ground quality to the outlet can vary over time, this ability to continually monitor and quantify electrical health is a benefit of some embodiments.

Figures 1A, 1B, 1C, 1D, 1E, 1F:
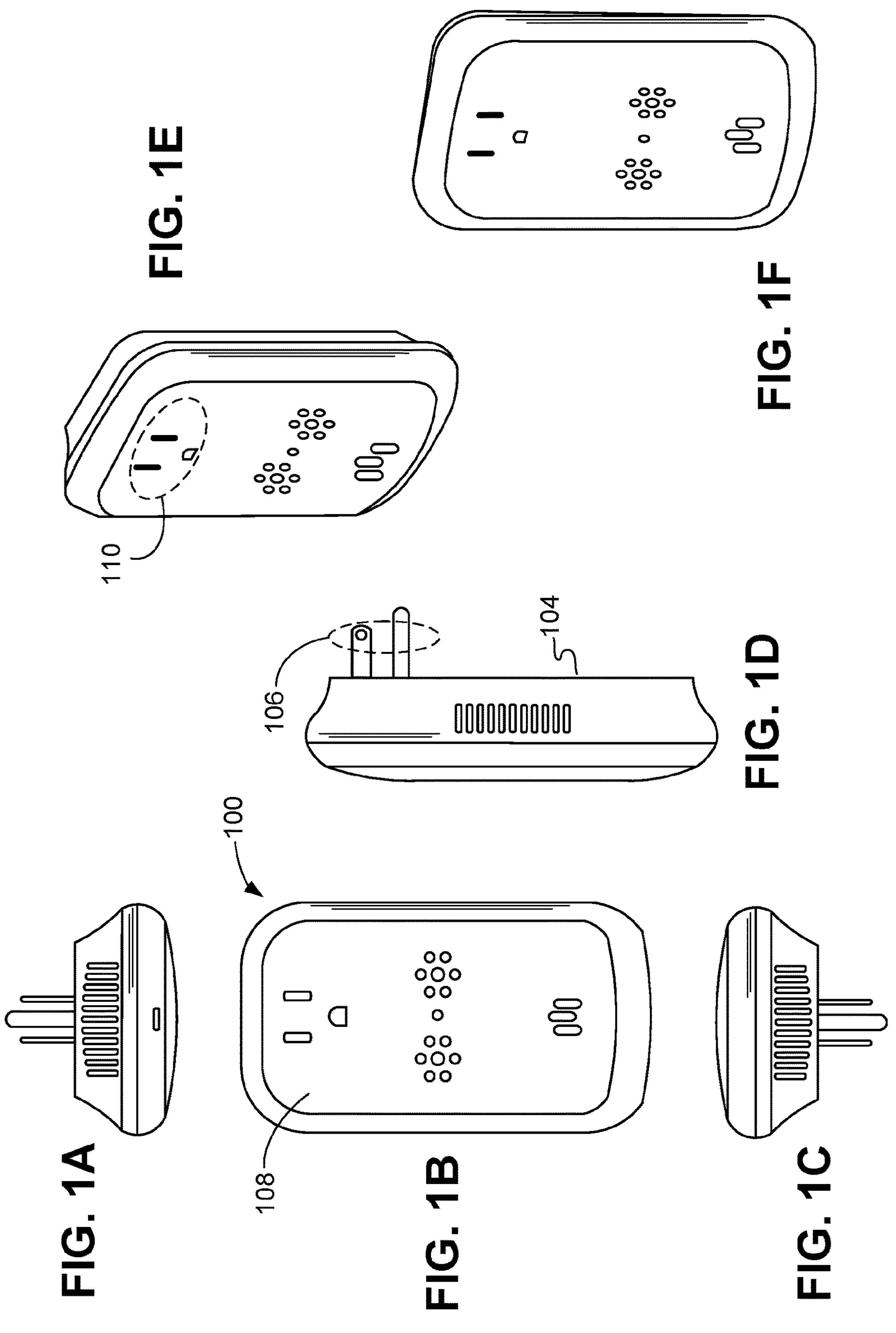
FIGS. 1A-1F are illustrations of a sensor node device that may be used in some embodiments.
Figure 2A:
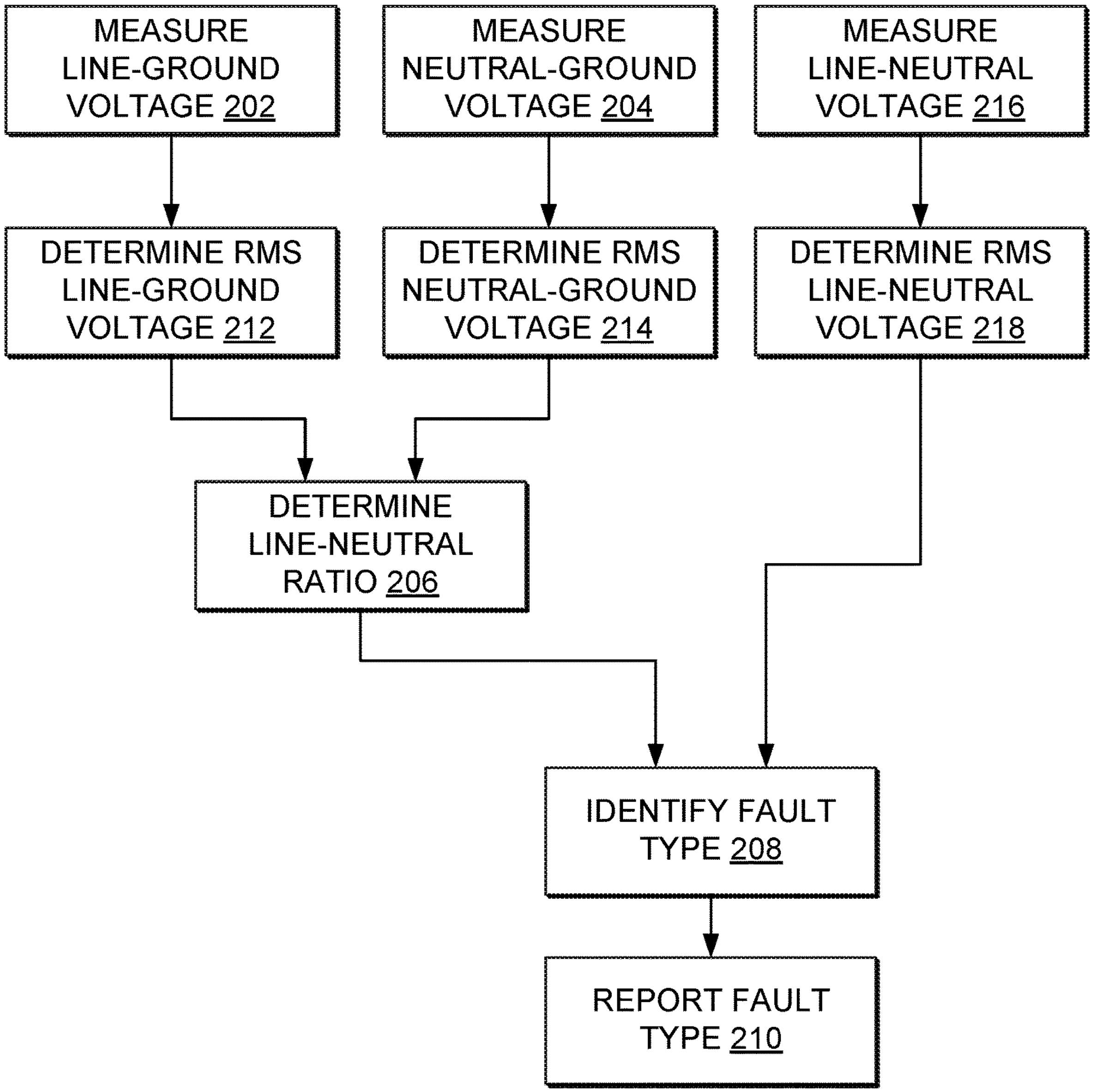
FIG. 2A is a flow diagram illustrating a method performed according to some embodiments.
Figure 2B:
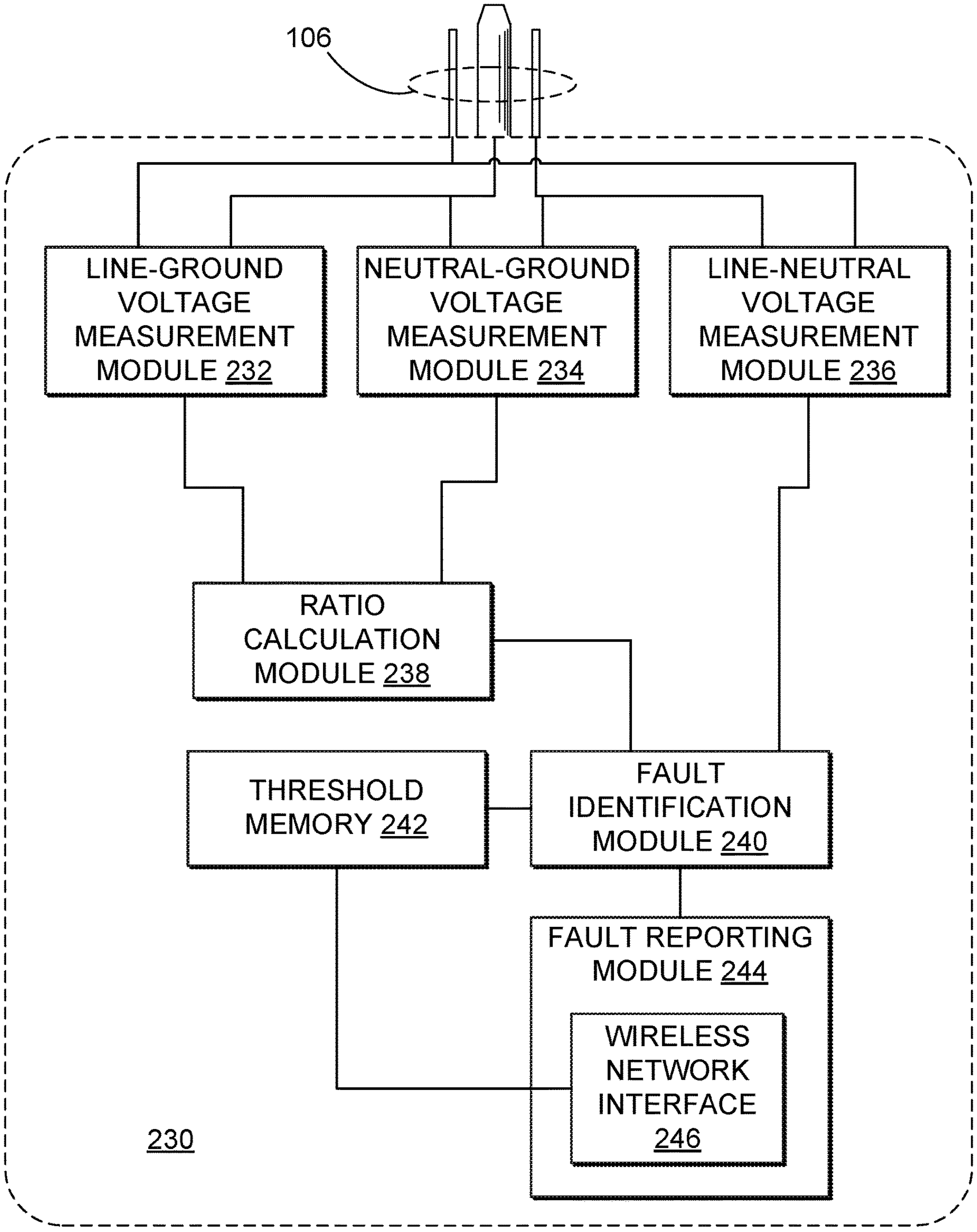
FIG. 2B is a functional block diagram illustrating a sensor device according to some embodiments.

An example embodiment is illustrated in FIGS. 2A-2B.

FIG. 2A is a flow chart illustrating a method according to some embodiments. In the example method, at 202, a line voltage is measured at an AC power outlet, and at 204, a neutral voltage is measured at the AC power outlet. At 206 ratio is determined between a magnitude (e.g. a root-mean-square, RMS, value) of the line voltage and a magnitude (e.g. an RMS value) of the neutral voltage. The ratio is referred to herein as a line/neutral ratio. An outlet fault is detected at 208 based at least in part on the line/neutral ratio (and possibly on other inputs as discussed below). An alert may be provided at 210 in response to detection of the outlet fault. The alert may indicate what type of fault has been detected and/or it may indicate the parameters that led to the conclusion that a fault was present, allowing a recipient to determine the fault type.

In some embodiments, the measurement of the line voltage is performed by taking measurements of values of the AC line voltage at a plurality of times (e.g. on a periodic basis) and calculating an RMS value at 212 from the plurality of measurements. The measurement of the neutral voltage may similarly be performed by taking measurements of values of the AC neutral voltage at a plurality of times (e.g. on a periodic basis) and calculating an RMS value at 214 from the plurality of measurements. The measurements of the AC voltage may be performed with the use of the analog-to-digital converter (ADC), with the resulting digital voltage values being processed to generate RMS values by a processor. In some embodiments, a plurality of ADCs are used to conduct simultaneous or near-simultaneous measurements of different voltages. In alternative embodiments, the same ADC may be used to measure both the line voltage and the neutral voltage, the ADC being coupled to different terminals at different times.

In some embodiments, the ADC samples the voltage (or voltages) at a frequency of at least 120 Hz (or at least twice the nominal AC power supply frequency where that frequency differs from 60 Hz). In some embodiments, the sampling of voltages may be phase locked or otherwise synchronized with the power supply voltage. In other embodiments, the sampling is performed without such synchronization.

In alternative embodiments, a magnitude of the line voltage and/or the neutral voltage may be determined at least in part with analog circuitry, for example by rectifying the AC voltage signal, low-pass filtering the rectified signal, and providing the filtered signal to an ADC.

In example embodiments, the measured line voltage is a voltage of an outlet line terminal relative to a voltage of the outlet ground (line-ground voltage), and the measured neutral voltage is a voltage of an outlet neutral terminal relative to the voltage of the outlet ground (neutral-ground voltage).

In some embodiments, the line/neutral ratio is a ratio between the RMS value of the line-ground voltage and the RMS value of the neutral-ground voltage. In alternative embodiments, where the voltage magnitude is not necessarily an RMS, the line/neutral ratio is a ratio between the magnitude of the line-ground voltage and the magnitude of the neutral-ground voltage.

In some embodiments, a measurement is further conducted at 216 of a voltage between the line terminal and the neutral terminal (line-neutral voltage) at the AC power outlet. The measurement of the line-neutral voltage may be performed by taking measurements of values of the AC line-neutral voltage at a plurality of times (e.g. on a periodic basis) and calculating an RMS value at 218 from the plurality of measurements. The measurements of the AC voltage may be performed with the use of the analog-to-digital converter (ADC), with the resulting digital voltage values being processed to generate RMS values by a processor. In some embodiments, different ADCs are used to measure the line voltage, the neutral voltage, and the line-neutral voltage. In some embodiments, the same ADC is used to measure the line voltage, the neutral voltage, and the line-neutral voltage the ADC being coupled to different terminals at different times.

In alternative embodiments, a magnitude of the line-neutral voltage may be determined at least in part with analog circuitry, for example by rectifying the AC voltage signal, low-pass filtering the rectified signal, and providing the filtered signal to an ADC.

In some embodiments, the measurement of one of the line-ground, neutral-ground, and line-neutral voltages is performed by calculating the voltage from two of the other measured voltages according to the following relationship:

$$V_{line\text{-}neutral} = V_{line\text{-}ground} - V_{neutral\text{-}ground}$$

In some embodiments, the detection of an outlet fault is based at least in part on the line/neutral ratio exceeding a first line/neutral ratio threshold. In some embodiments, the detection of an outlet fault is based at least in part on the line/neutral ratio falling below a second line/neutral ratio threshold.

The measuring of voltages and determining of a ratio line/neutral ratio are performed on a continual basis in some embodiments.

In some embodiments, the alert of a network fault is sent through a wireless network connection, such as a WiFi or Bluetooth connection.

In some embodiments, the type of outlet fault may be determined based at least in part on the line/neutral ratio and the line-neutral voltage. The alert of a network fault may include information indicating the type of outlet fault that has been detected.

The type of electrical fault may be determined based on ranges of values of the line/neutral ratio and/or the line-neutral voltage. The relevant ranges may be closed-ended ranges (e.g. a range between a lower bound and an upper bound) or open-ended ranges (e.g. a range of all values above a lower bound, or all values below an upper bound). Different fault types may be associated with different ranges. For example, a first fault type may be detected in response to a determination that: (1) the line-neutral voltage is in a first range associated with the first fault type, and (2) the line/neutral ratio is in a second range associated with the first fault type. The first range (for the line-neutral voltage) may be a range between a first upper bound and first lower bound, and the second range (for the line-neutral ratio) may be between a second upper bound and second lower bound.

In some embodiments, the fault type is further determined based on a duration of time that the relevant values (e.g. the line-neutral voltage and the line-neutral ratio) fall within the relevant ranges. Different durations may be associated with different fault types.

FIG. 2B schematically illustrates an example apparatus 230 according to some embodiments.

Voltage measurement modules include one or more of a line-ground voltage measurement module 232, a neutral-ground voltage measurement module 234, and a line-neutral voltage measurement module 236. Each module is coupled to an appropriate pair of prongs of an AC power plug (e.g. prongs 106). The coupling may be performed through circuitry such as a voltage divider that allows voltages to be accurately measured using voltages lower than the original line voltage. One type of circuitry that can be included in a voltage measurement module includes circuitry that provides a (possibly voltage-divided or otherwise down-scaled) AC signal representing the voltage between the appropriate prongs, an ADC to digitize that AC signal, and a processor or other digital logic circuitry to calculate a magnitude of the voltage (e.g. an RMS value) from a plurality of digitized measurements of the original signal. The different voltage measurement modules may use the same ADC and the same processor, or they may have separate ADC and processing circuitry.

Another type of circuitry that can be included in a voltage measurement module includes a rectifier circuit that rectifies a (possibly voltage-divided or otherwise down-scaled) AC signal representing the voltage between the appropriate prongs, a low-pass filter to filter the rectified signal, and an ADC to digitize the rectified signal. Other circuitry for measurement of the magnitude of the voltages used herein may alternatively be used in different embodiments.

As noted above, in some embodiments, one of the voltage measurement modules may operate using voltages detected by other modules.

A ratio calculation module 238 is provided to calculate the line/neutral ratio. The ratio calculation module may include a processor other logic circuitry configured to the ratio, e.g. by dividing the line-ground voltage magnitude by the neutral-ground voltage magnitude. The processor may be the same processor used to calculate the magnitude (e.g. RMS) values, or it may be different logic circuitry.

A fault identification module 240 is provided to detect a fault and, in some embodiments, to identify a fault type. In some embodiments, the fault identification module is provided in a sensor node device, such as device 100. Alternatively (or additionally), in some embodiments, the fault identification module may be provided in a separate device in communication with the sensor node device. For example, the fault identification module may be implemented in a hub device that is in wireless communication with the sensor node device. In such embodiments, the sensor node device may send the relevant data (e.g. the measured voltages and/or ratios, possibly with measurement time or duration information) to the hub device to determine the presence and/or type of fault.

The fault identification module 240 may operate to determine whether (and, in some cases, for how long) the line-neutral voltage and/or the line/neutral ratio are within the relevant ranges associated with different fault types. The ranges themselves (e.g. lower bound values and upper bound values) and any associated duration values may be stored in a threshold memory 242 along with information identifying the fault type to which they pertain. The fault identification module may include a processor or other logic circuitry to make the appropriate determination.

A fault reporting module 244 is provided to issue an alert and/or to provide other information indicating the detection of the presence and/or type of fault. The fault reporting module may include a wireless interface 246 (e.g. a WiFi, Bluetooth, or other interface) for reporting this information. In some embodiments, the fault reporting module 244 may report a fault using features other than a wireless network interface. For example, a visual alert (e.g. on an LED or display screen) and/or an audio alert (e.g. an alarm noise such as a beep and/or a synthetic voice from a speaker) may be provided directly from the device 230 to indicate the presence and/or the type of fault detected.

In some embodiments, the thresholds (e.g. voltage and ratio upper and lower bounds and associated durations) in the threshold memory may be updated through the wireless interface.

The operation of any of the modules herein may be implemented entirely or in part by the use of a processor configured to perform the associated operations. The configuration of the processor to perform the associated operations may include the provision of a non-transitory storage medium storing instructions that are operative, when executed on the processor, to perform the associated operations. Other types of logic circuits, such as a field-programmable gate array, may also be used.

Figure 3A:
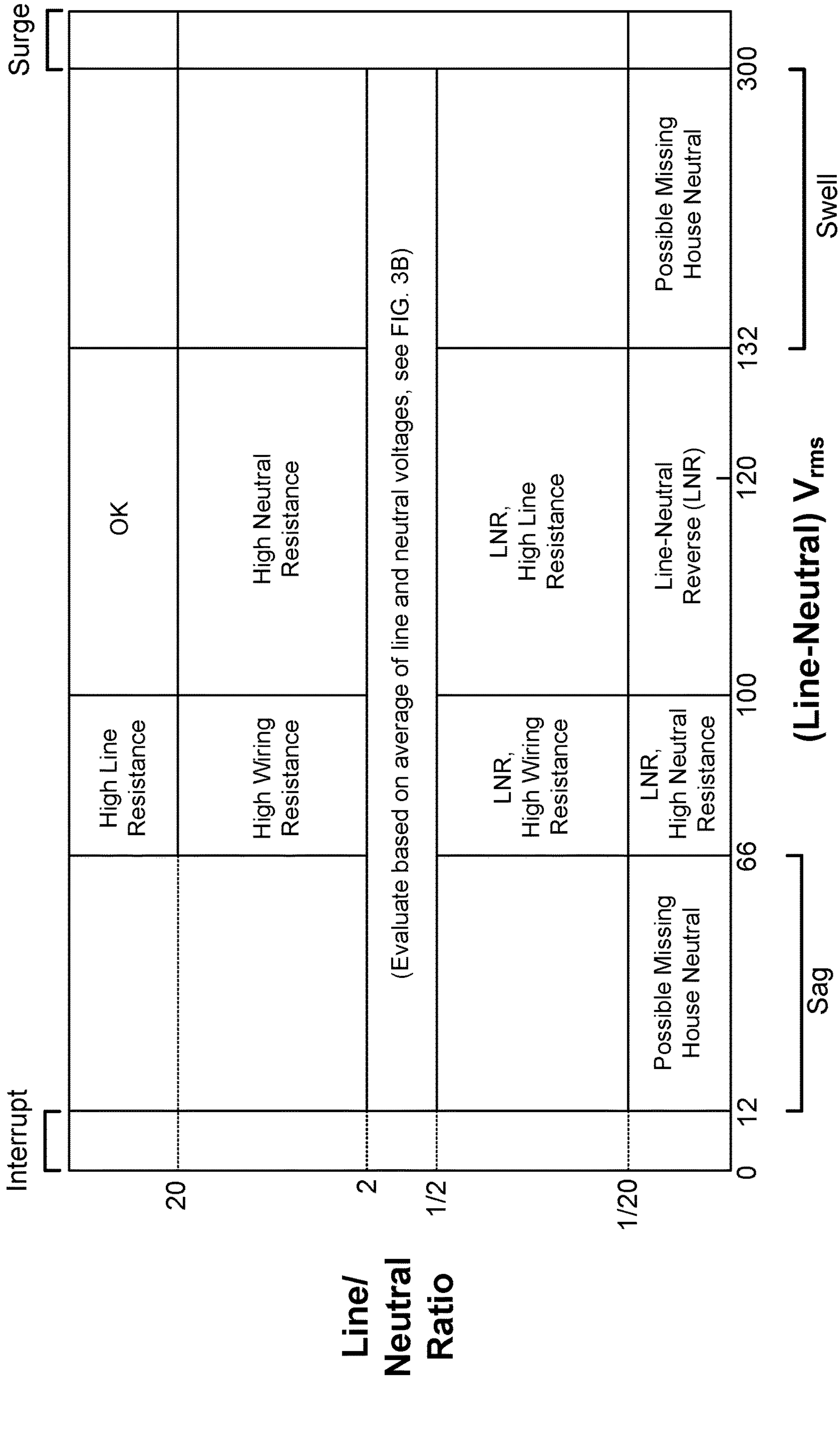
FIG. 3A is a chart illustrating examples of electrical faults that may be detected based on a line/neutral ratio and a line-neutral voltage. The horizontal axis is the difference between line and neutral voltage and the vertical axis being the ratio between line and neutral voltage.
Figure 3B:
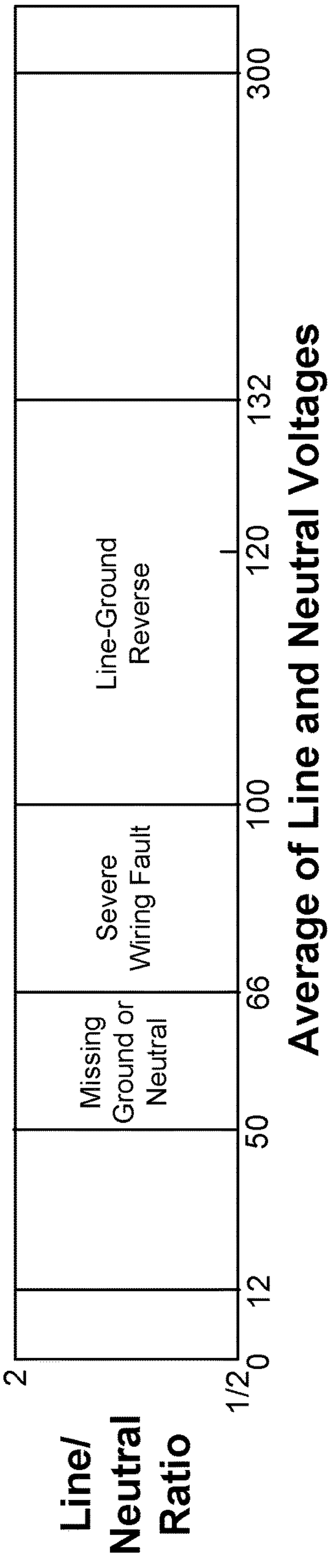
FIG. 3B is a chart illustrating examples of electrical faults that may be detected based on a line/neutral ratio and an average of line and neutral voltages.

FIGS. 3A and 3B are charts providing examples of ranges of voltages and ratios along with associated fault types that can be used in some embodiments. Information of the type shown in FIGS. 3A and 3B may be stored in a threshold memory 242 as shown in FIG. 2B.

With reference to FIG. 3A, when (1) the line/neutral ratio is above a lower bound of 20, and (2) the line-neutral voltage is above a lower bound of 100 and below an upper bound of 132, the system may determine that no fault is present. (The specific bounds given here are examples only and may be different in different embodiments.) However, when the line/neutral ratio and line-neutral voltage are outside these bounds, the system may determine that a fault is present and may issue an appropriate alert. The system may further use the line/neutral ratio and line-neutral voltage to determine the type of fault.

As one example of fault identification, when (1) the line/neutral ratio is above a lower bound of 2 and below an upper bound of 20, and (2) the line-neutral voltage is between a lower bound of 100 and an upper bound of 132 volts, the system may determine that the fault is related to high neutral resistance. As another example, when (1) the line/neutral ratio is above a lower bound of about 1/20 and below an upper bound of about 1/2, and (2) the line-neutral voltage is between a lower bound of 100 and an upper bound of 132 volts, the system may determine that the fault is related to high line resistance.

In some embodiments, when the line/neutral ratio is in a predetermined range, such as between around 0.5 and around 2, a fault is identified based on an average of the line voltage and the neutral voltage (e.g. an average of the RMS line-ground voltage and the RMS neutral-ground voltage), as shown in FIG. 3B. For example, if the line/neutral ratio is within this range, and the average is between around 50 and 66 volts, the fault may be identified as a missing ground or neutral. If the line/neutral ratio is within this range, and the average is between around 100 and 132 volts, the fault may be identified as a reversal of line and ground connections.

In some embodiments, an alert of the detected fault may be issued only after the condition has persisted for a threshold amount of time, such as 3 seconds. The amount of time may vary for different fault types, and it may vary for different embodiments. Various examples of faults that may be identified include, but are not limited to, high line resistance, high wiring resistance, high neutral resistance, missing ground or neutral, severe wiring fault, line-neutral reverse, along with voltage sags and swells.

Example embodiments allow for detection of a potential outlet fault even when a load (such as an appliance) is drawing power from the same outlet to which the sensor device 100 is attached. For example, an appliance or other load may be plugged into an auxiliary outlet 110 of the sensor device that connects through to the respective prongs 106.

The measurement of RMS ($V_{neutral\text{-}ground}$) provides information regarding the current contributions of all loads on that circuit branch heading back to the breaker box. (The loads do not contribute equally to the voltage we see, as appliances further away from the breaker box contribute a higher voltage drop per unit of current.) In normal operation, that voltage should be below about $5V_{rms}$. If it is not, a determination may be made that either there is too high a load on that branch—which should be resolved by a circuit breaker—or that there is too much resistance in the branch, which could be from a loose screw or corroded terminals. One benefit of some example embodiments is providing the ability to find these resistive faults on circuits that a conventional tester may not detect.

Figure 11:
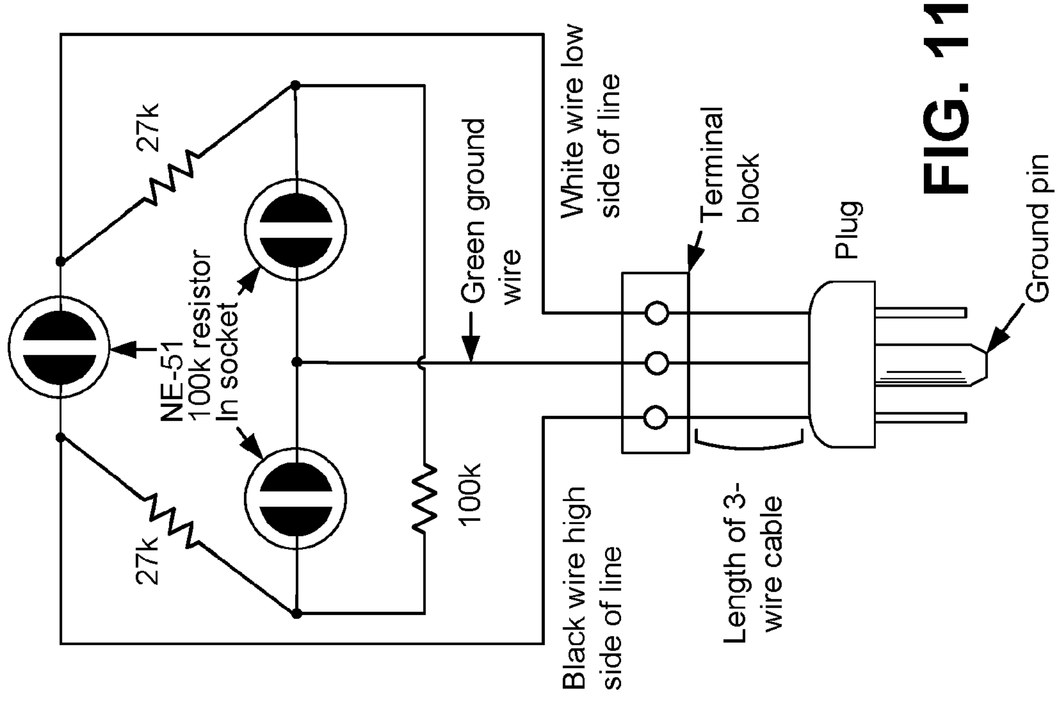
FIG. 11 is a schematic diagram of a prior art circuit tester.

A conventional detector, such as that shown in FIG. 11, has three neon bulbs (or LEDs in more modern units) that will light up in the correct (or incorrect) pattern depending on how the outlet is wired. These require about a milliamp or so for the bulb to light up. That current can be supplied by a fairly wide range of voltages, lighting up the correct combination of lamps without indicating a problem as long as line, neutral, and ground are on the right pins. In contrast, example embodiments can warn the user that (even if the outlet is wired correctly) there is a high resistance on line, neutral, or both that could cause a fire hazard or other problems.

devices at different outlets using other criteria (e.g. visibility, user convenience) and the sensor devices communicate (either directly or through a hub device) to identify one or more pairs that are on different phases. Once those pairs are identified, rising and falling of line-neutral voltages in tandem at such pairs may trigger the issuance of an alert of possible missing neutral. Even in cases where only one phase is monitored, example embodiments operate to warn the user of the chance for a broken outside neutral by frequent voltage swings in both directions outside of the normal utility operating range.

Table 1 identifies some examples of status reports, along with corresponding issues and potential routes for resolution, that can be provided to the user in some embodiments.

TABLE 1

| Outlet-Status (The string descriptor in the status report) | Root cause issue (General nature of the wiring issue) | End-user action (What a user should/could do to resolve the wiring issue) |
|---|---|---|
| "OK" | No wiring issue detected | No action, outlet is fine. |
| "High Neutral Resistance" (Report may indicate a duration or percentage of time this occurs) | Corrosion over time, or too high current for loads on branch. | Check to see if there are high current loads on the branch, like a washing machine, pump, large power tools, or refrigerator. If these loads are intermittent, it may be fine. If they last a long time, such as for charging a car, an electrician should check the wiring for corroded connections and fix. For long duration events, the wiring should be replaced with a heavier gauge, or a separate branch should be run for the heavy load. |
| "Line-Ground Reverse" or "Hot-Ground Reverse" | Incorrectly wired outlet. | Contact electrician for immediate repair. This can cause dangerous voltages to appear on metal appliances - a human safety risk, and permanent damage to electronic devices. |
| "Missing Ground or Neutral" | Typically corrosion over time. Could also be that screws were not fully tightened on outlet. | Contact electrician for repair. Outlet may need to be replaced, or wiring may need to be sanded to provide clean surfaces and reattached. For metal appliances, the lack of a ground means that its main safety feature (protecting against shorts between line and case) will not work. |

In some embodiments, the sensor node is operative to detect a missing house neutral. In this scenario, all outlets inside the house are wired correctly, and an outlet tester would indicate all outlets it tests pass, due to how ground and neutral are tied together at the breaker box. However, if the neutral line between the house and the outside power goes bad, e.g. a broken or high-resistance connection, voltages on the two different line phases inside the house will bounce up and down depending on which appliances are turned off or on. Damagingly high and low voltages can occur in this case and cause harm to expensive equipment-like the compressor for an air conditioner.

By continuously monitoring the line voltages inside the house, example embodiments can determine if that outside neutral connection has failed. In some embodiments, detection of a missing neutral is performed using more than one sensor device, with at least two devices being plugged into outlets having opposite phases. In the case of a missing neutral, sensor devices on opposite phases of the two lines coming in will have line-neutral voltages that rise or drop in tandem, e.g., if one phase goes up 20V, the other phase will drop 20V. In some embodiments, the user sets up the sensor devices such at least one device appears on each phase. In some embodiments, the user sets up a plurality of sensor In some embodiments, different faults may be reported with different priorities. For example, a lower-priority fault may not be reported, where a higher-priority fault has been detected. One example arrangement of fault priorities (in order of decreasing priority) is as follows: line-ground reverse, missing ground or neutral, high line resistance, high neutral resistance. Other priority orderings may alternatively be used.

In some embodiments, the identification of a fault is further based on values of the neutral-ground voltage VN. For example, the detection of a high neutral resistance fault may be based at least in part on a value of the neutral-ground voltage. In some embodiments, a fault may be detected based at least in part on a neutral-ground voltage (e.g. RMS voltage) above 4.32V, although different thresholds may be used in different embodiments.

The various thresholds and ranges used to detect and identify electrical faults may by different in different use cases (e.g. different thresholds and ranges would be used for outlets that are intended to supply 220V versus those that are intended to supply 120V). Such thresholds and ranges may be selected using simulations of household circuits under various conditions. Examples of such simulations are illustrated in FIGS. 4-7.

Figure 4:
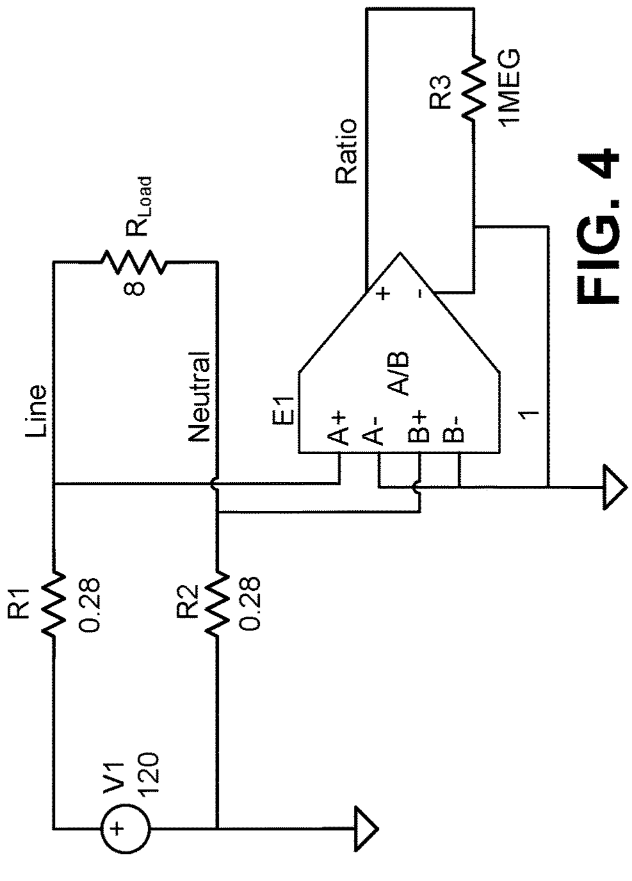
FIG. 4 illustrates a circuit used for simulations of the effects of load ($R_{load}$) and source voltage (V1) on different outlet voltages for normal line (R1) and neutral (R2) resistance values.

FIG. 4 illustrates a circuit used for simulations of the effects of load ($R_{load}$) and source voltage (V1) on different outlet voltages for normal line (R1) and neutral (R2) resistance values. The simulation may use, for example, a 15 A, 8 ohm load at 120V. In an example of a simulation, the load range is varied from 8 ohms to 80 ohms. The input voltage range is varied from 108 to 132V. A maximum wiring resistance of 0.28 ohms is used. Such a simulation may indicate that, under these conditions, the line-neutral voltage has a minimum of 100.93V and the line-neutral ratio has a minimum of 29.57.

Figure 5:
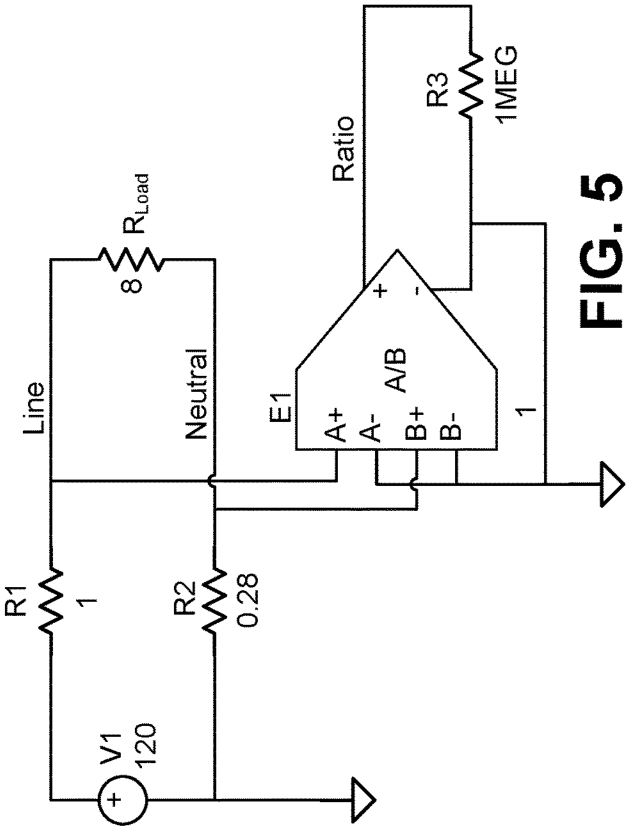
FIG. 5 illustrates a circuit used for simulations of the effects of load ($R_{load}$) and source voltage (V1) on different outlet voltages under conditions of high line resistance (R1).

FIG. 5 illustrates a circuit used for simulations of the effects of load ($R_{load}$) and source voltage (V1) on different outlet voltages under conditions of high line resistance (R1). With such a simulation, it may be observed that the high line resistance results in a low line-neutral voltage but a normal line/neutral ratio and normal neutral voltage.

Figure 6:
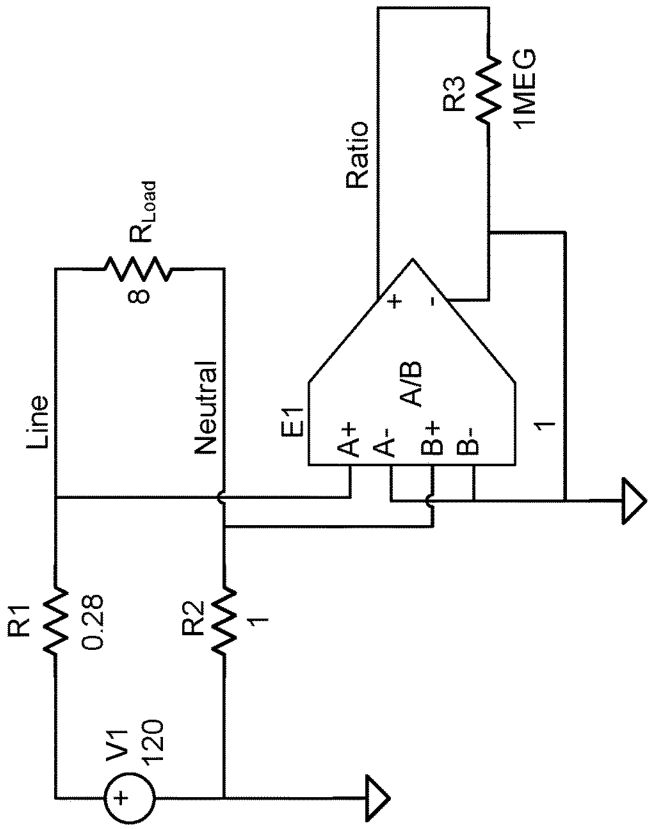
FIG. 6 illustrates a circuit used for simulations of the effects of load ($R_{load}$) and source voltage (V1) on different outlet voltages under conditions of high neutral resistance (R2).

FIG. 6 illustrates a circuit used for simulations of the effects of load ($R_{load}$) and source voltage (V1) on different outlet voltages under conditions of high neutral resistance (R2). Simulations show that, with a sufficiently high load, high neutral resistance results in a low line/neutral ratio and a high neutral voltage.

Figure 7:
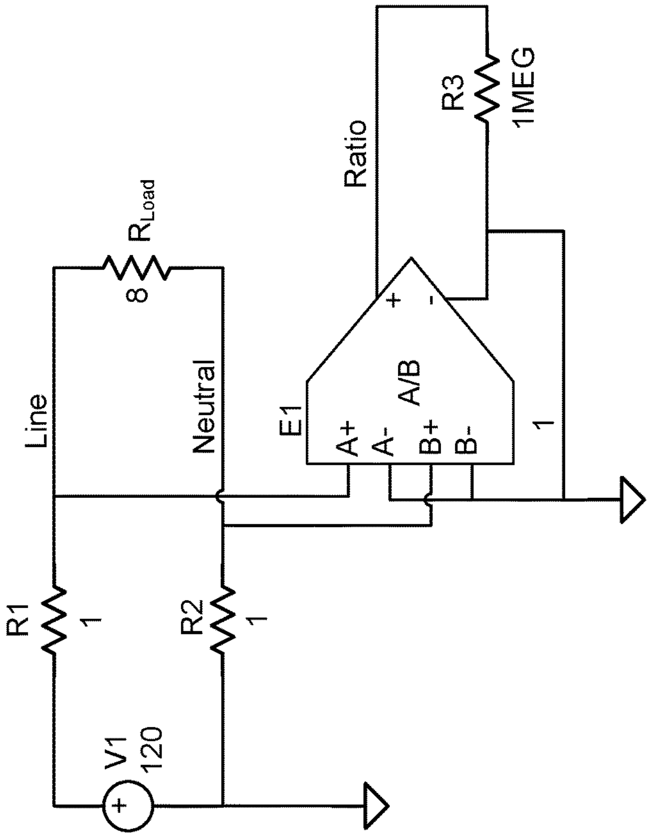
FIG. 7 illustrates a circuit used for simulations of the effects of load ($R_{load}$) and source voltage (V1) on different outlet voltages under conditions of high line resistance (R1) and high neutral resistance (R2).

FIG. 7 illustrates a circuit used for simulations of the effects of load ($R_{load}$) and source voltage (V1) on different outlet voltages under conditions of high line resistance (R1) and high neutral resistance (R2).

Figure 8:
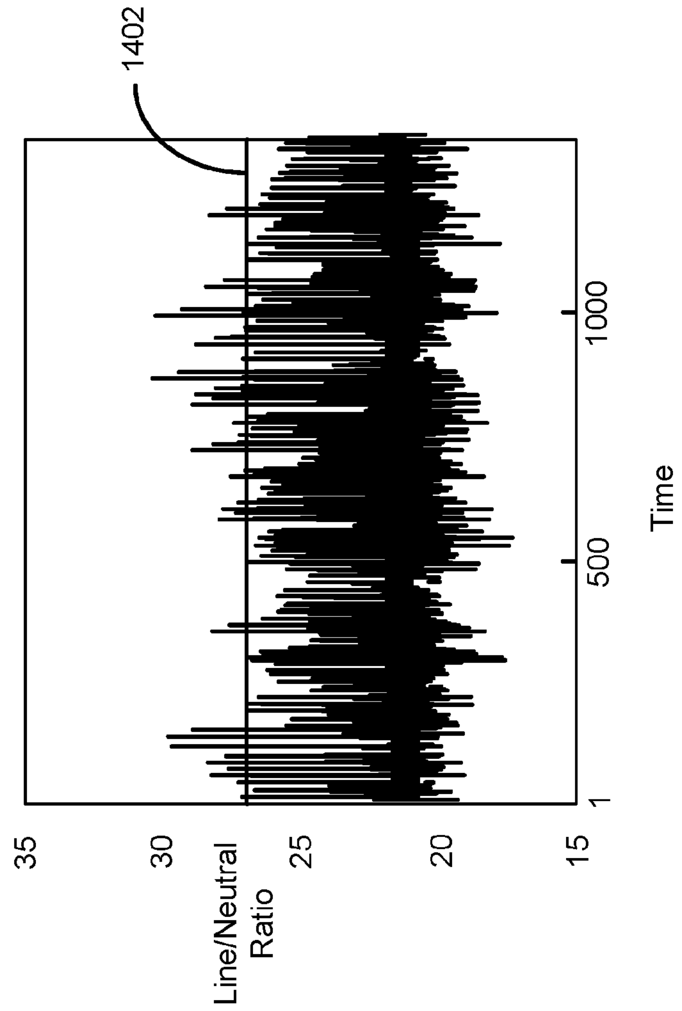
FIG. 8 is a graph illustrating example measurements, as a function of time, of the line-neutral ratio of an example sensor device installed in a kitchen environment.
Figure 9A:
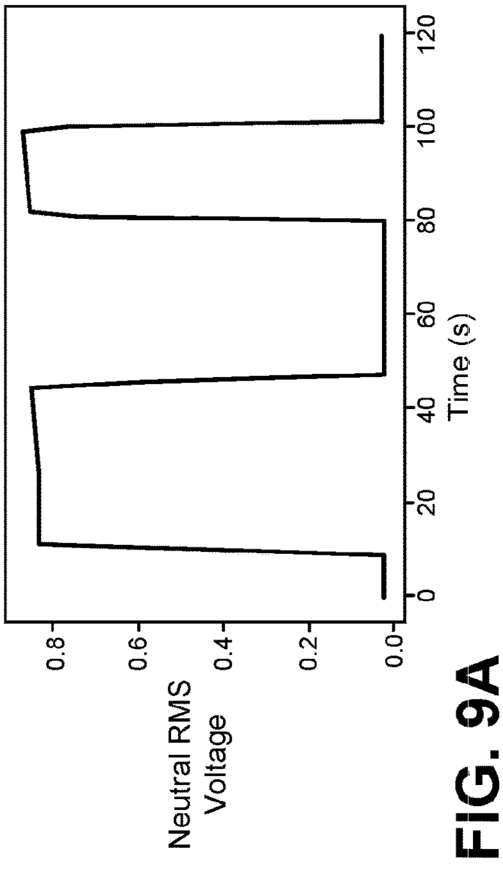
FIGS. 9A-9D are graphs illustrating example measurements, as a function of time, of a neutral-ground voltage (9A), a line-ground voltage (9B), a line-neutral voltage (9C), and a line-neutral ratio (9D) during operation of a toaster.
Figure 9B:
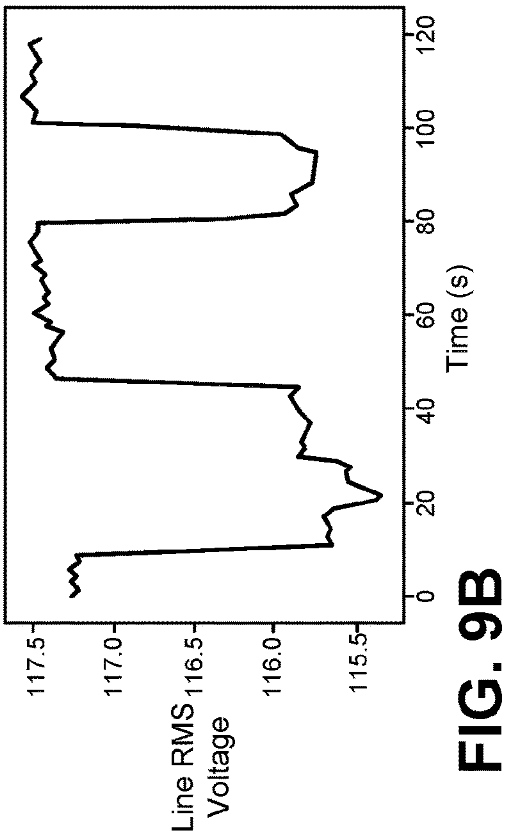
Figure 9C:
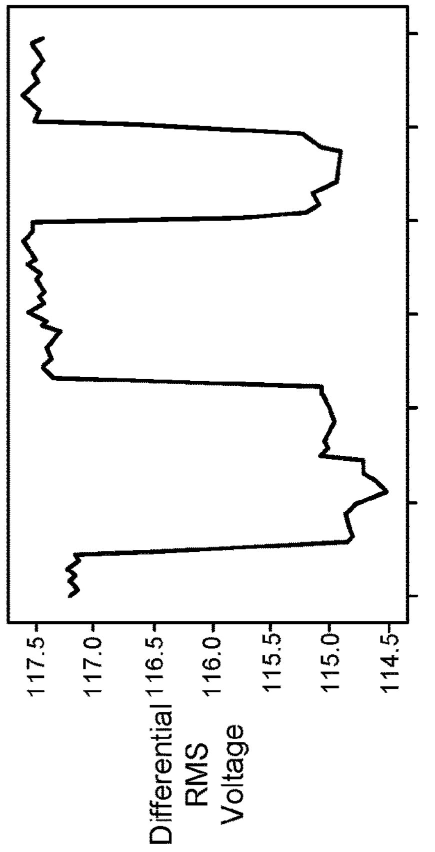
Figure 9D:
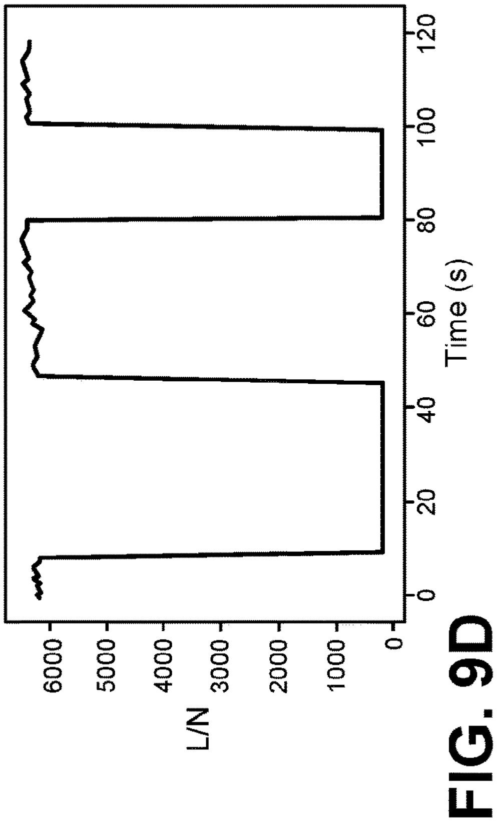
Figure 10A:
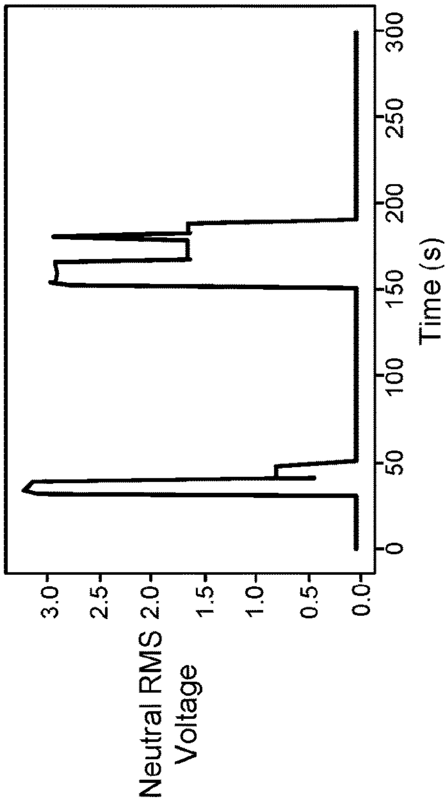
FIGS. 10A-10D are graphs illustrating example measurements, as a function of time, of a neutral-ground voltage (10A), a line-ground voltage (10B), a line-neutral voltage (10C), and a line-neutral ratio (10D) during operation of a hair dryer.
Figure 10B:
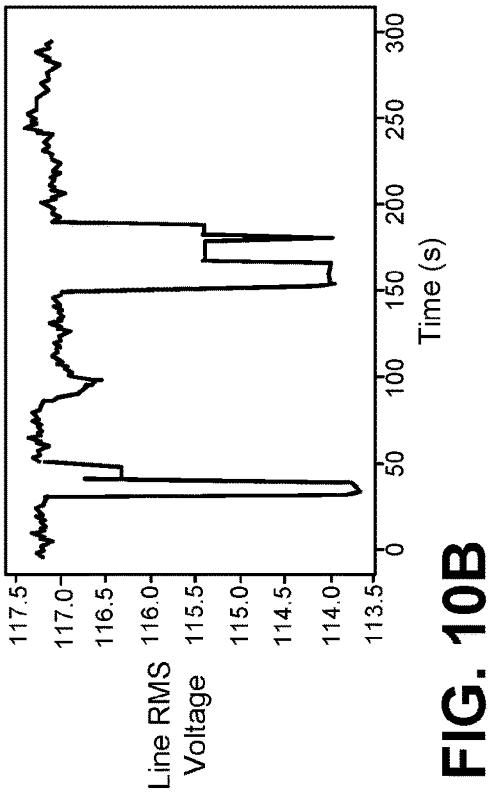
Figure 10C:
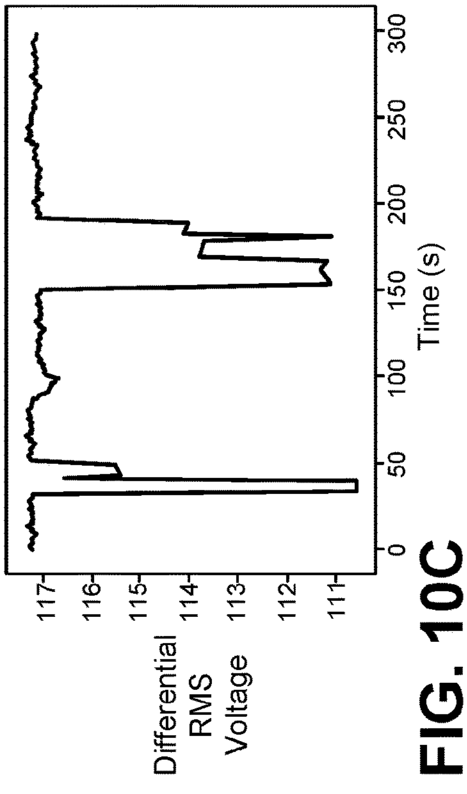
Figure 10D:
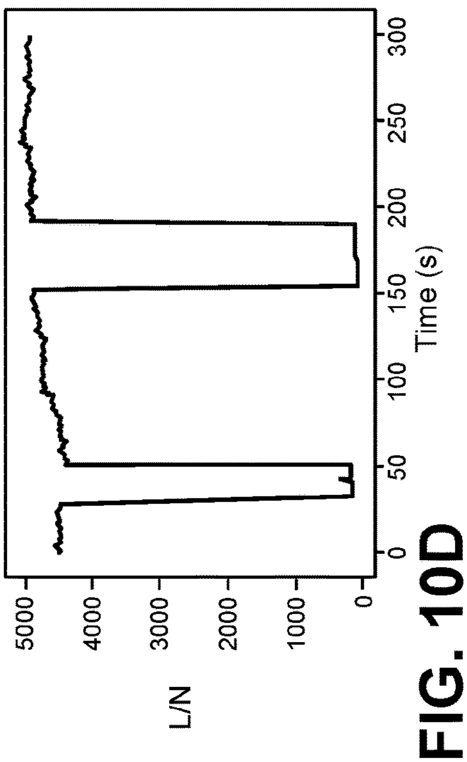
Figure 11:
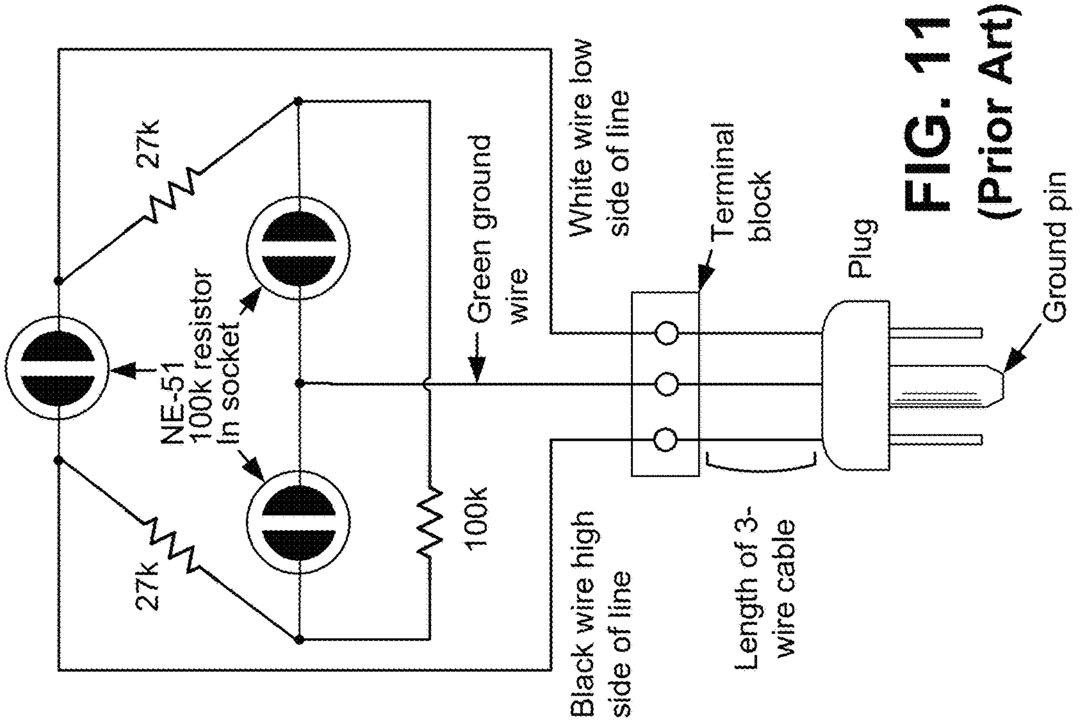
FIG. 11 (Prior Art)
Figure 8:
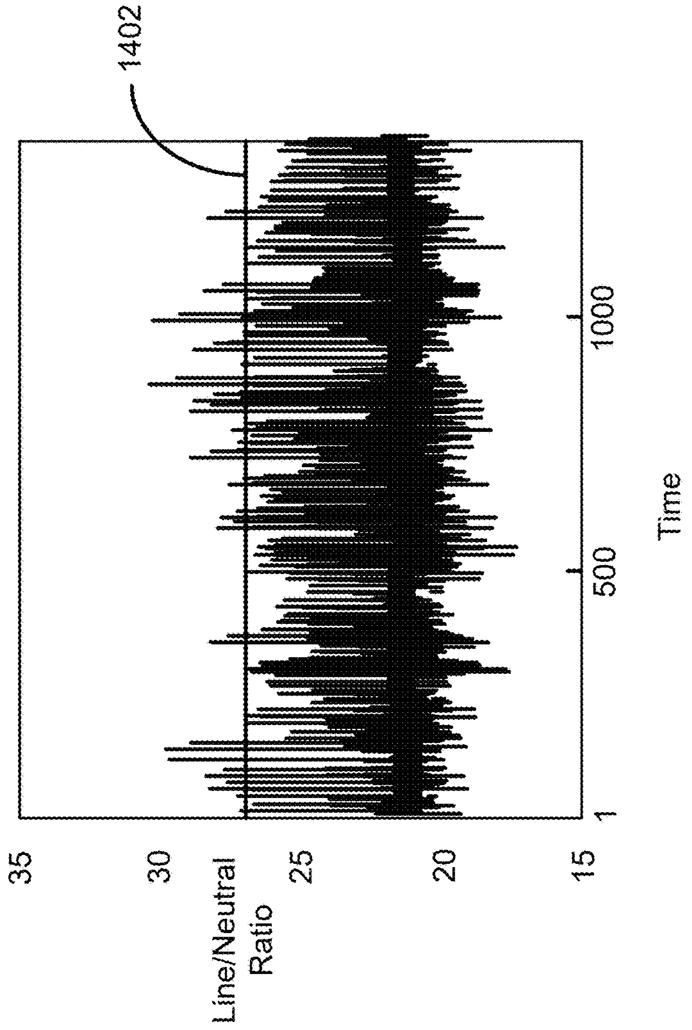
Figure 9B:
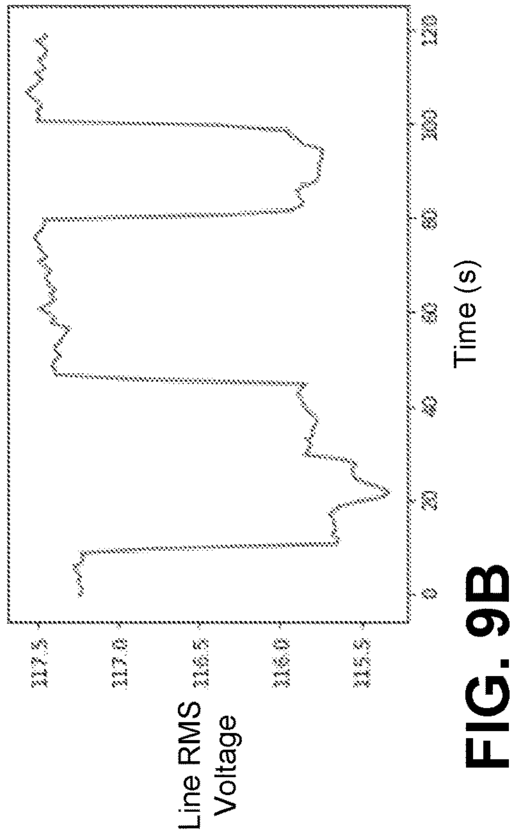
Figure 9D:
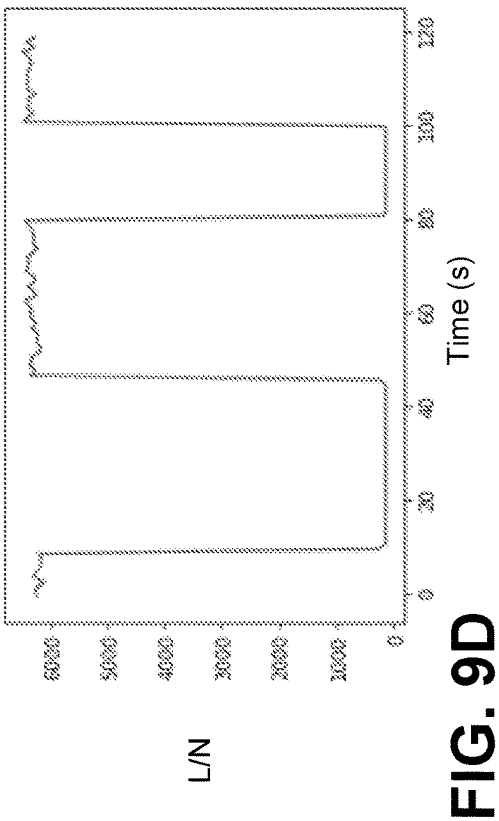
Figure 9A:
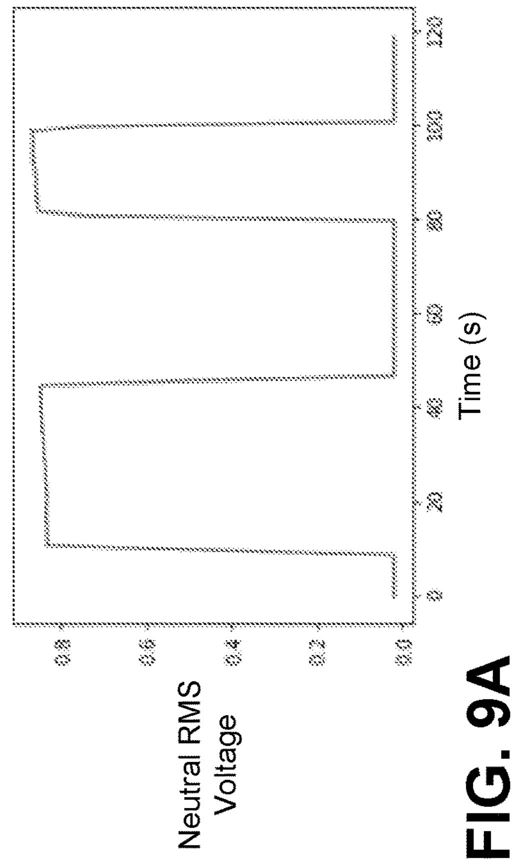
Figure 9C:
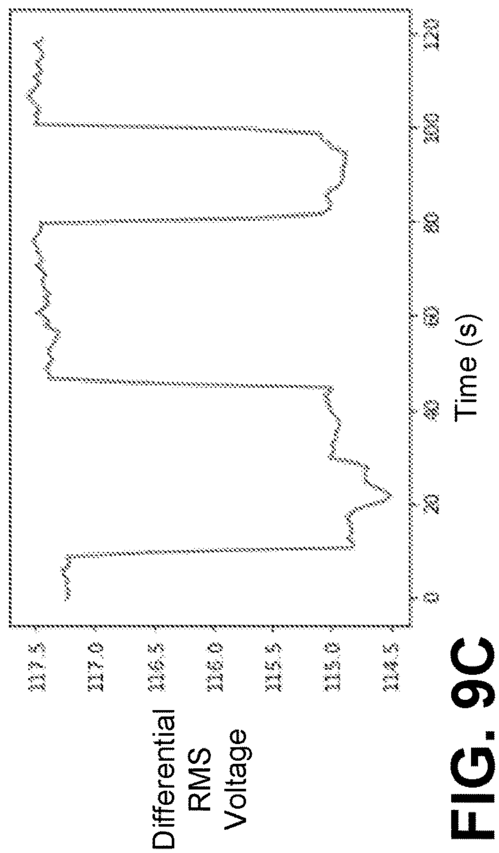
Figure 10B:
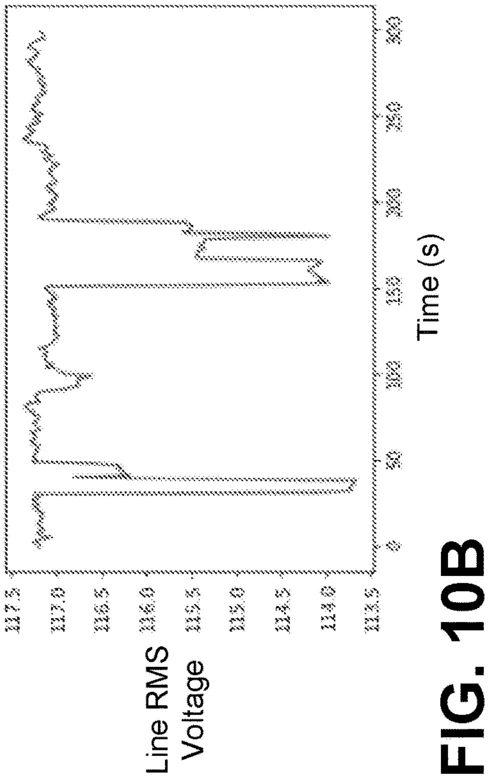
Figure 10D:
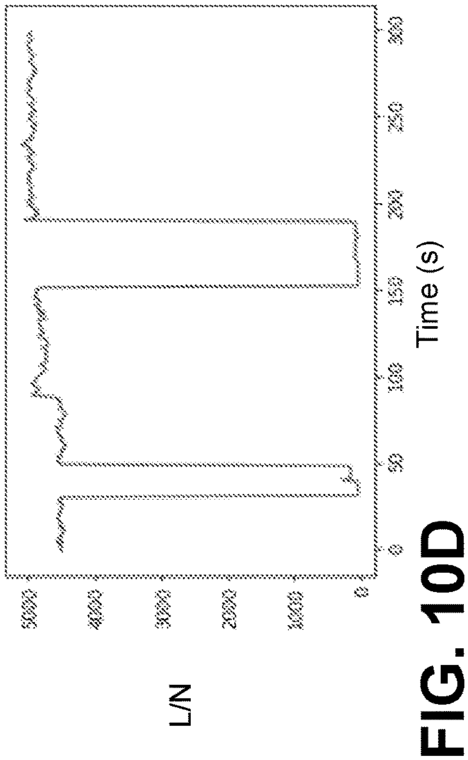
Figure 10A:
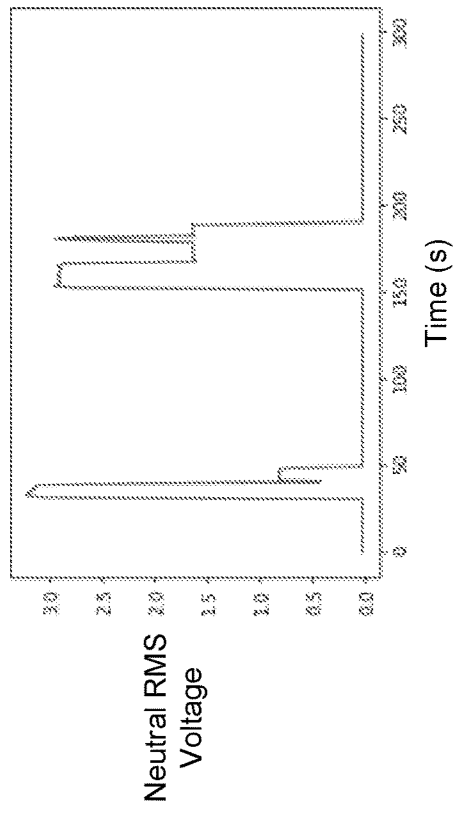
Figure 10C:
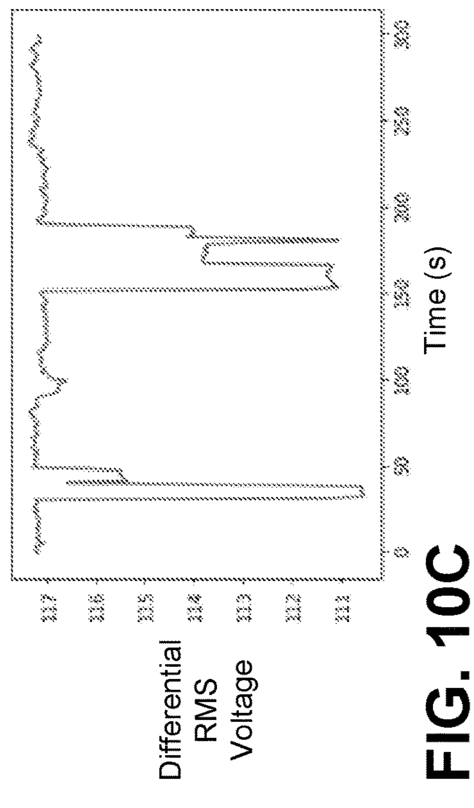

FIG. 8 is a graph schematically illustrating example measurements, as a function of time, of the line-neutral ratio of an example sensor device installed in a kitchen environment. While an "ok threshold" 1402 of around 27 is illustrated in FIG. 8, it should be noted that some other threshold, such as 20, may be used. Short excursions below the threshold may occur during normal conditions, e.g. as devices turn on and off, without necessarily triggering an indication that there is a problem with outlet wiring.

FIGS. 9A-9D are graphs illustrating example measurements, as a function of time, of a neutral-ground voltage (9A), a line-ground voltage (9B), a line-neutral voltage (9C), and a line-neutral ratio (9D) during operation of a toaster.

FIGS. 10A-10D are graphs illustrating example measurements, as a function of time, of a neutral-ground voltage (10A), a line-ground voltage (10B), a line-neutral voltage (10C), and a line-neutral ratio (10D) during operation of a hair dryer.

Some embodiments operate to detect and report on voltage surges, sags, swells, and interruptions. A sag (also called a "dip") may be detected in case of a decrease to between 0.1 and 0.9 pu (per unit) in RMS voltage or current at the power frequency for durations of 0.5 cycles to 1 minute. A swell may be detected in case of an increase to between 1.1 pu and 1.8 pu in RMS voltage or current at the power frequency durations from 0.5 to 1 minute. An interruption may be detected in case of a decrease to less than 0.1 pu for at least 0.5 seconds. In some embodiments, the detection and reporting of an interruption, sag or swell may indicate whether the issue is instantaneous, momentary, or temporary. For example, a sag or swell with a duration of 0.5 to 30 cycles may be reported to be "instantaneous." An interruption, sag or swell with a duration of 0.5 to to 3 seconds may be reported to be "momentary." An interruption, sag or swell with a duration of 3 seconds to one minute may be reported to be "temporary." A surge may be detected in case of an increase to greater than 1.8 pu. A surge event may be detected over a shorter duration, such as less than 0.5 cycles. Different reporting nomenclature may be used in different embodiments. In some embodiments, the duration of the event is reported expressly in cycles, seconds, or another unit. In some embodiments, maximum and/or minimum values associated with the event may be reported using pu value, voltage values, or other units.

In some embodiments, a possible cause for the electrical event may be reported along with the information identifying the type and/or duration of the event. For example, in the event of a surge, a report may be made indicating a possible cause, such as lightning, electrostatic discharge, switch mode power supply noise, or a small appliance being turned on or off. In the event of a swell, a report may be made indicating a possible cause, such as large equipment being turned on, ground faults, or capacitor bank switching. In the event of a sag, a report may be made indicating a possible cause, such as large equipment being turned on, wind, lightning, accidents, or pests. In the event of an interruption, a report may be made indicating a possible cause, such as issues with circuit breakers or reclosers.

The detection and reporting of a sag or swell may use different amplitude limits for different durations of the voltage excursion, as illustrated in Table 2.

TABLE 2

| DURATION | AMPLITUDE LIMITS |
|---|---|
| 8-50 msec: | +20%, −30% |
| 50 msec-500 msec | +15%, −20% |
| longer than .5 sec | residential: +5%, −5% |
| | industrial: +10%, −10% |

The fault map of FIG. 3B includes a fault type of "Missing Ground or Neutral." Considering only the voltages available with the processor does not necessarily provide enough information to distinguish between a missing ground or neutral because these are connected together back at the breaker box. However, in an AC powered system, if neutral is missing the processor would not be powered and the measurement would not be possible. However, in a battery powered system, which may be used in some embodiments, the processor may distinguish between those conditions based on one or more further observations, such as checking if current is available to charge the battery (then neutral is still attached) or not.

A method according to some embodiments includes measuring a line voltage at an AC power outlet; measuring a neutral voltage at the AC power outlet; determining a line/neutral ratio between the line voltage and the neutral voltage; and detecting an outlet fault based at least in part on the line/neutral ratio. Some such embodiments further include providing an alert in response to detection of the outlet fault.

In some embodiments, measuring the line voltage comprises measuring a root-mean-square (RMS) value of the line voltage, and measuring the neutral voltage comprises measuring an RMS value of the neutral voltage, the line/neutral ratio being a ratio between the RMS value of the line voltage and the RMS value of the neutral voltage.

In some embodiments, measuring the line voltage comprises measuring a root-mean-square (RMS) value of the line voltage relative to an outlet ground voltage, and measuring the neutral voltage comprises measuring an RMS value of the neutral voltage relative to the outlet ground voltage, the line/neutral ratio being a ratio between the RMS value of the line voltage and the RMS value of the neutral voltage.

Some embodiments further include measuring a line-neutral voltage at the AC power outlet, wherein the outlet fault is further determined based at least in part on the line-neutral voltage.

In some embodiments, the line-neutral voltage is an RMS value of the line-neutral voltage.

In some embodiments, the detection of an outlet fault is based at least in part on the line/neutral ratio exceeding a first line/neutral ratio threshold. In some embodiments, the detection of an outlet fault is based at least in part on the line/neutral ratio falling below a second line/neutral ratio threshold.

In some embodiments, the measuring and determining are performed on a continual basis.

In some embodiments, the alert is sent through a wireless network connection. In some embodiments, the alert is provided as a visual and/or auditory alert.

In some embodiments, measuring the line voltage comprises taking a plurality of line voltage measurements using an analog-to-digital converter and determining a root-mean-square (RMS) value of the line voltage from the plurality of line voltage measurements; and measuring the neutral voltage comprises taking a plurality of neutral voltage measurements using an analog-to-digital converter and determining a root-mean-square (RMS) value of the neutral voltage from the plurality of line voltage measurements; the line/neutral ratio being a ratio between the RMS value of the line voltage and the RMS value of the neutral voltage.

A method according to some embodiments comprises: measuring a line-ground voltage at an AC power outlet; measuring a neutral-ground voltage at the AC power outlet; measuring a line-neutral voltage at the AC power outlet; determining a line/neutral ratio between the line-ground voltage and the neutral-ground voltage; and identifying an outlet fault type based at least in part on the line/neutral ratio and the line-neutral voltage. Some such embodiments further include providing an alert identifying the outlet fault type.

In some embodiments, a first outlet fault type is detected in response to a determination that: (1) the line-neutral voltage is in a first range associated with the first fault type, and (2) the line/neutral ratio is in a second range associated with the first fault type.

In some embodiments, a first outlet fault type is detected in response to a determination that: (1) an average of line-ground voltage and the neutral-ground voltage is in a first range associated with the first fault type, and (2) the line/neutral ratio is in a second range associated with the first fault type.

In some embodiments, the first range is between a first upper bound and first lower bound. In some embodiments, the first range is above a first upper bound. In some embodiments, the first range is below a first lower bound.

In some embodiments, the second range is between a second upper bound and second lower bound. In some embodiments, the second range is above a second upper bound. In some embodiments, the second range is below a second lower bound.

In some embodiments, the first fault type is further detected in response to a determination that, for at least a first duration associated with the first fault type: (1) the line-neutral voltage is in a first range associated with the first fault type, and (2) the line/neutral ratio is in a second range associated with the first fault type.

In embodiments further include determining an average between a line-ground voltage and a line-neutral voltage, wherein determination of a fault type is based at least in part on the average between the line-ground voltage and the line-neutral voltage.

Some embodiments include a system comprising at least one processor configured to perform any of the methods described herein.

An apparatus according to some embodiments includes a module for measuring a line voltage at an AC power outlet; a module measuring a neutral voltage at the AC power outlet; a module for determining a line/neutral ratio between the line voltage and the neutral voltage; and a module for detecting an outlet fault based at least in part on the line/neutral ratio. Some such embodiments include a module for providing an alert in response to detection of the outlet fault.

In some embodiments, measuring the line voltage includes measuring a root-mean-square (RMS) value of the line voltage, and measuring the neutral voltage comprises measuring an RMS value of the neutral voltage, the line/neutral ratio being a ratio between the RMS value of the line voltage and the RMS value of the neutral voltage.

In some embodiments, measuring the line voltage includes measuring a root-mean-square (RMS) value of the line voltage relative to an outlet ground voltage, and measuring the neutral voltage includes measuring an RMS value of the neutral voltage relative to the outlet ground voltage, the line/neutral ratio being a ratio between the RMS value of the line voltage and the RMS value of the neutral voltage.

In some embodiments, the apparatus further includes a module for measuring a line-neutral voltage at the AC power outlet, wherein the outlet fault is further determined based at least in part on the line-neutral voltage.

In some embodiments, the line-neutral voltage is an RMS value of the line-neutral voltage.

In some embodiments, the detection of an outlet fault is based at least in part on the line/neutral ratio exceeding a first line/neutral ratio threshold. In some embodiments, the detection of an outlet fault is based at least in part on the line/neutral ratio falling below a second line/neutral ratio threshold.

In some embodiments, the measuring and determining are performed on a continual basis.

In some embodiments, the alert is sent through a wireless network connection.

In the apparatus of some embodiments, measuring the line voltage includes taking a plurality of line voltage measurements using an analog-to-digital converter and determining a root-mean-square (RMS) value of the line voltage from the plurality of line voltage measurements; and measuring the neutral voltage includes taking a plurality of neutral voltage measurements using an analog-to-digital converter and determining a root-mean-square (RMS) value of the neutral voltage from the plurality of line voltage measurements; where the line/neutral ratio is a ratio between the RMS value of the line voltage and the RMS value of the neutral voltage.

An apparatus of some embodiments includes a module for measuring a line-ground voltage at an AC power outlet; a module for measuring a neutral-ground voltage at the AC power outlet; a module for measuring a line-neutral voltage at the AC power outlet; a module for determining a line/neutral ratio between the line-ground voltage and the neutral-ground voltage; and a module for identifying an outlet fault type based at least in part on the line/neutral ratio and the line-neutral voltage. Some such embodiments further include providing an alert identifying the outlet fault type.

In some embodiments, a first outlet fault type is detected in response to a determination that: (1) the line-neutral voltage is in a first range associated with the first fault type, and (2) the line/neutral ratio is in a second range associated with the first fault type.

In some embodiments, the first fault type is further detected in response to a determination that, for at least a first duration associated with the first fault type: (1) the line-neutral voltage is in a first range associated with the first fault type, and (2) the line/neutral ratio is in a second range associated with the first fault type.

Some embodiments further include a module for determining an average between a line-ground voltage and a line-neutral voltage, wherein determination of a fault type is based at least in part on the average between the line-ground voltage and the line-neutral voltage.

As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Other variations of the described embodiments are contemplated. The above-described embodiments are intended to be illustrative, rather than restrictive, of the present invention. The scope of the invention is thus not limited by the examples given above but rather is defined by the following claims.

The invention claimed is:

1. An apparatus comprising:

a module configured to measure a line voltage at an AC power outlet;

a module configured to measure a neutral voltage at the AC power outlet;

a module configured to determine a line/neutral ratio between the line voltage and the neutral voltage; and a module configured to detect an electrical fault based at least in part on the line/neutral ratio;

wherein the module configured to detect an electrical fault is further configured to identify an electrical fault type, and wherein for at least a first range of line/neutral ratio values, the electrical fault type is determined based on the line/neutral ratio and on a difference between the line voltage and the neutral voltage.

2. The apparatus of claim 1, further comprising a module configured to provide an alert in response to detection of the electrical fault.

3. The apparatus of claim 1, wherein:

the module configured to measure the line voltage is configured to measure a root-mean-square (RMS) value of the line voltage; and the module configured to measure the neutral voltage is configured to measure an RMS value of the neutral voltage;

the line/neutral ratio being a ratio between the RMS value of the line voltage and the RMS value of the neutral voltage.

4. The apparatus of claim 1, wherein:

the module configured to measure the line voltage is configured to measure a root-mean-square (RMS) value of the line voltage relative to an outlet ground voltage; and the module configured to measure the neutral voltage is configured to measure an RMS value of the neutral voltage relative to the outlet ground voltage;

the line/neutral ratio being a ratio between the RMS value of the line voltage and the RMS value of the neutral voltage.

5. The apparatus of claim 1, wherein the module configured to detect an electrical fault is configured to detect the electrical fault in response to the line/neutral ratio falling below a predetermined threshold.

6. An apparatus comprising:

a module configured to measure a line voltage at an AC power outlet;

a module configured to measure a neutral voltage at the AC power outlet;

a module configured to determine a line/neutral ratio between the line voltage and the neutral voltage; and a module configured to detect an electrical fault based at least in part on the line/neutral ratio;

wherein the module configured to detect an electrical fault is further configured to identify an electrical fault type, and wherein for at least a second range of line/neutral ratio values, the electrical fault type is determined based on an average of the line voltage and the neutral voltage.

7. The apparatus of claim 6, wherein:

the module configured to measure the line voltage is configured to measure a root-mean-square (RMS) value of the line voltage; and the module configured to measure the neutral voltage is configured to measure an RMS value of the neutral voltage;

the line/neutral ratio being a ratio between the RMS value of the line voltage and the RMS value of the neutral voltage.

8. The apparatus of claim 6, wherein:

the module configured to measure the line voltage is configured to measure a root-mean-square (RMS) value of the line voltage relative to an outlet ground voltage; and the module configured to measure the neutral voltage is configured to measure an RMS value of the neutral voltage relative to the outlet ground voltage;

the line/neutral ratio being a ratio between the RMS value of the line voltage and the RMS value of the neutral voltage.

9. A method comprising:

measuring a line voltage at an AC power outlet;

measuring a neutral voltage at the AC power outlet;

determining a line/neutral ratio between the line voltage and the neutral voltage;

detecting an electrical fault based at least in part on the line/neutral ratio; and identifying an electrical fault type, wherein, for at least a first range of line/neutral ratio values, the electrical fault type is determined based on the line/neutral ratio and on a difference between the line voltage and the neutral voltage.

10. The method of claim 9, further comprising providing an alert in response to detection of the electrical fault.

11. The method of claim 9, wherein:

measuring the line voltage comprises measure a root-mean-square (RMS) value of the line voltage; and measuring the neutral voltage comprises measuring an RMS value of the neutral voltage;

the line/neutral ratio being a ratio between the RMS value of the line voltage and the RMS value of the neutral voltage.

12. The method of claim 9, wherein:

measuring the line voltage comprises measuring a root-mean-square (RMS) value of the line voltage relative to an outlet ground voltage; and measuring the neutral voltage comprises measuring an RMS value of the neutral voltage relative to the outlet ground voltage;

the line/neutral ratio being a ratio between the RMS value of the line voltage and the RMS value of the neutral voltage.

13. The method of claim 9, wherein the electrical fault is detected in response to the line/neutral ratio falling below a predetermined threshold.

14. A method comprising:

measuring a line voltage at an AC power outlet;

measuring a neutral voltage at the AC power outlet;

determining a line/neutral ratio between the line voltage and the neutral voltage;

detecting an electrical fault based at least in part on the line/neutral ratio; and identifying an electrical fault type, wherein, for at least a second range of line/neutral ratio values, the electrical fault type is determined based on an average of the line voltage and the neutral voltage.

15. The method of claim 14, wherein:

measuring the line voltage comprises measure a root-mean-square (RMS) value of the line voltage; and measuring the neutral voltage comprises measuring an RMS value of the neutral voltage;

the line/neutral ratio being a ratio between the RMS value of the line voltage and the RMS value of the neutral voltage.

16. The method of claim 14, wherein:

measuring the line voltage comprises measuring a root-mean-square (RMS) value of the line voltage relative to an outlet ground voltage; and measuring the neutral voltage comprises measuring an RMS value of the neutral voltage relative to the outlet ground voltage;

the line/neutral ratio being a ratio between the RMS value of the line voltage and the RMS value of the neutral voltage.

17. An apparatus comprising:

a set of power plug prongs including at least a line prong, a neutral prong, and a ground prong;

at least one analog-to-digital converter coupled to the set of power plug prongs;

at least one processor configured to receive input from the at least one analog-to-digital converter and to perform at least:

obtaining a line voltage at an AC power outlet;

obtaining a neutral voltage at the AC power outlet;

determining a line/neutral ratio between the line voltage and the neutral voltage;

detecting an electrical fault based at least in part on the line/neutral ratio; and identifying an electrical fault type, wherein:

for at least a first range of line/neutral ratio values, the electrical fault type is determined based on the line/neutral ratio and on a difference between the line voltage and the neutral voltage; and for at least a second range of line/neutral ratio values, the electrical fault type is determined based on an average of the line voltage and the neutral voltage.

18. The apparatus of claim 17, wherein:

obtaining the line voltage comprises calculating a root-mean-square (RMS) value of the line voltage from a plurality of line voltage measurements from the at least one analog-to-digital converter; and obtaining the neutral voltage comprises calculating an RMS value of the neutral voltage from a plurality of neutral voltage measurements from the at least one analog-to-digital converter;

the line/neutral ratio being a ratio between the RMS value of the line voltage and the RMS value of the neutral voltage.

19. The apparatus of claim 17, further comprising a network interface, wherein the processor is further configured to report the electrical fault through the network interface.

* * * * *